(12) United States Patent
Narumi et al.

(10) Patent No.: US 8,818,741 B2
(45) Date of Patent: Aug. 26, 2014

(54) METHOD OF DETECTING CHANGES IN INTEGRATED CIRCUITS USING THERMALLY IMAGED TEST PATTERNS

(75) Inventors: Robert T. Narumi, Yorba Linda, CA (US); Parviz Saghizadeh, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 507 days.

(21) Appl. No.: 12/418,491

(22) Filed: Apr. 3, 2009

(65) Prior Publication Data

US 2010/0256933 A1 Oct. 7, 2010

(51) Int. Cl.
*G01R 31/00* (2006.01)
*G01R 31/3183* (2006.01)
*G01R 31/311* (2006.01)

(52) U.S. Cl.
CPC ...... *G01R 31/318357* (2013.01); *G01R 31/311* (2013.01)
USPC ............................................ 702/58; 702/134

(58) Field of Classification Search
USPC .................... 702/58, 130, 134, 135, 136, 182
See application file for complete search history.

(56) References Cited

U.S. PATENT DOCUMENTS

| | | | | |
|---|---|---|---|---|
| 5,440,566 | A * | 8/1995 | Spence et al. | 374/41 |
| 5,923,836 | A * | 7/1999 | Barch et al. | 714/33 |
| 6,594,610 | B1 * | 7/2003 | Toutounchi et al. | 702/117 |
| 7,007,206 | B2 * | 2/2006 | Anonson | 714/46 |
| 2009/0106714 | A1 * | 4/2009 | Culp et al. | 716/5 |

* cited by examiner

*Primary Examiner* — John Breene
*Assistant Examiner* — Yaritza H Perez Bermudez
(74) *Attorney, Agent, or Firm* — Christie, Parker & Hale, LLP (57) ABSTRACT

A method of testing an electrical circuit includes applying test vectors to a circuit, detecting thermal changes in portions of the circuit during application of the test vectors, and identifying unexpected activity corresponding to the thermal changes. The method supplements standard testing techniques to provide a new method of assessing operation of fabricated integrated circuits and programmed field programmable gate arrays.

12 Claims, 5 Drawing Sheets

METHOD OF DETECTING CHANGES IN INTEGRATED CIRCUITS USING THERMALLY IMAGED TEST PATTERNS

STATEMENT REGARDING FEDERALLY SPONSORED RESEARCH OR DEVELOPMENT

This invention was made with Government support from the Defense Advanced Research Projects Agency (DARPA) under contract number HR0011-08-C-0005. The U.S. Government has certain rights in this invention.

FIELD OF THE INVENTION

The present invention relates generally to testing of integrated circuits and other types of circuitry. More specifically, the invention relates to utilizing thermal imaging to detect changes in a specific circuit for failure analysis and detection of unexpected circuitry or circuit changes.

BACKGROUND

Integrated circuits are utilized in a variety of different applications, including many electronic applications. Integrated circuits are generally manufactured to perform specific tasks or operations, and include circuitry designed specifically for such operations or applications. As such, an integrated circuit which is designed for a specific purpose includes circuitry dedicated to the specific purpose, and detailed considerations are made toward the design and arrangement of the circuitry. Field-programmable gate arrays (FPGAs) are also widely used in electronics. FPGAs are a type of integrated circuit programmable by an end user. FPGAs are generally manufactured without any preset configurations, and are programmed by the end user to perform more specific tasks or operations.

Integrated circuits and FPGAs can be interchangeable for executing various digital functions. Each has its respective advantages. For example, FPGAs may be more versatile as they are reprogrammable, but may be limited with respect to performing more complex operations in a single device for which an integrated circuit is specifically designed to perform. As such, many designers utilize both integrated circuits and FPGAs, depending on which may be more suitable for a particular application.

Design processes of integrated circuits and FPGAs are different. The circuitry in integrated circuits is designed specifically for each particular application, and as such, designers customize integrated circuit layouts for device manufacturing. FPGAs, on the other hand, are designed to be general purpose, and designers program the connections between logic blocks in FPGAs based on the application.

As such, integrated circuits and FPGAs may both be designed to execute desired functions. As manufacturing is often outsourced, testing procedures have been implemented to verify that manufactured integrated circuits and FPGAs perform as expected. To this extent, automatic test pattern generators (ATPGs) are often used in integrated circuit and FPGA testing to determine if there are any manufacturing defects. Alternatively, other testing methods, such as application of custom random or functional test vectors, Joint Test Action Group (JTAG) interfaces, or other test methods are utilized to verify the electrical functionality of a device. Each of these existing testing methods involves a variation of the application of specific testing inputs, and comparing resulting outputs with a set of reference or expected outputs.

SUMMARY OF THE INVENTION

Aspects of exemplary embodiments of the invention relate to utilization of thermal imaging to supplement existing integrated circuit and FPGA testing techniques for obtaining more detailed test information.

In an exemplary embodiment, the invention provides a method of testing an electrical circuit, including: selecting test vectors for electrically activating portions of a first electrical circuit of a preselected design over time; generating a set of expected results including information on portions of the first electrical circuit expected to be activated by application of the test vectors and times over which the portions are expected to be activated; applying the test vectors to a second electrical circuit of the preselected design; detecting activated portions of the second electrical circuit over time by identifying thermal changes in the second electrical circuit during application of the test vectors; comparing the activated portions of the second electrical circuit with the portions expected to be activated over time; and identifying unexpected activity in the second electrical circuit from the comparison.

DETAILED DESCRIPTION

Figure 1:
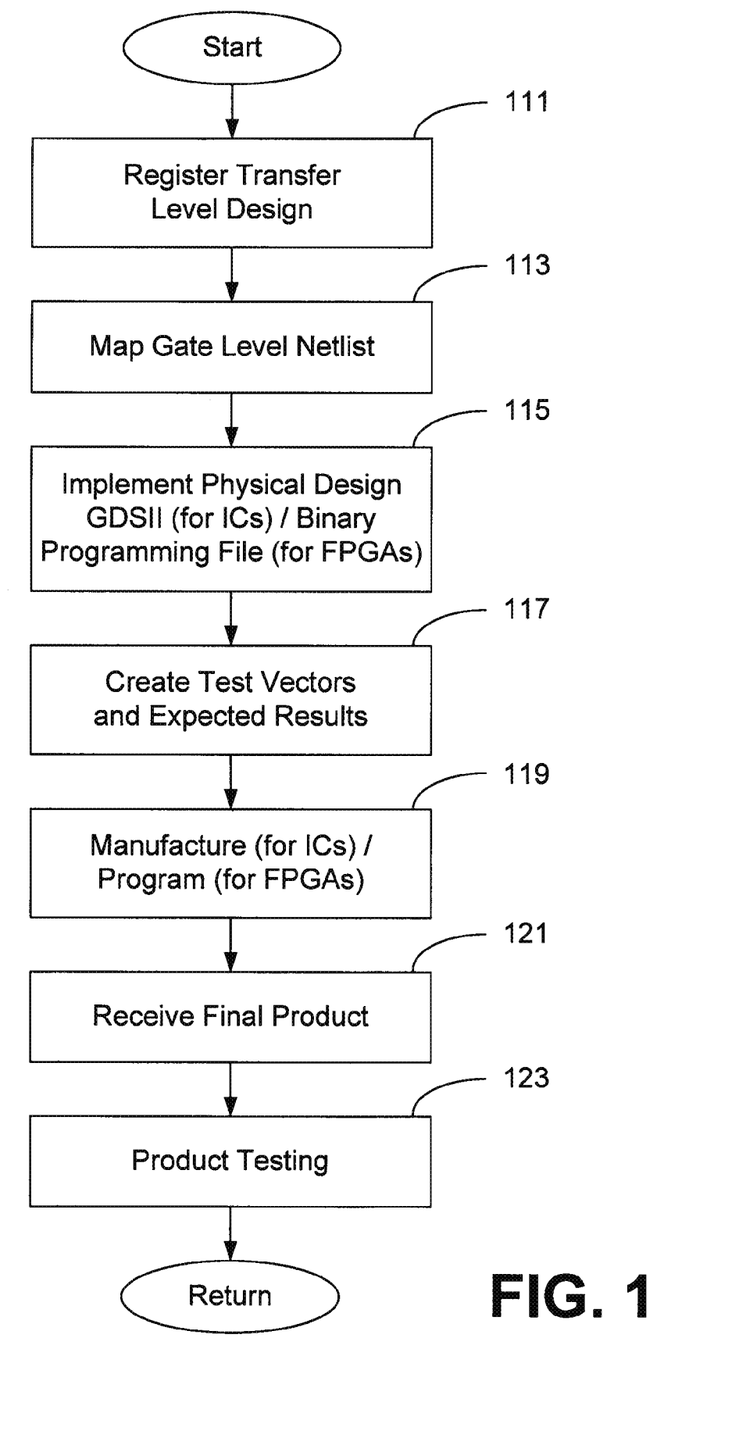
FIG. 1 is a flow diagram illustrating a design, fabrication and/or programming, and testing process for an integrated circuit or FPGA in accordance with an embodiment of the present invention.

FIG. 1 is a flow diagram illustrating a design, manufacturing, and testing process for an integrated circuit or field programmable gate array (FPGA) in accordance with an embodiment of the present invention. Manufacturing processes depend on the type of hardware, for example, manufacturing FPGAs may involve programming the FPGAs, while manufacturing of an integrated circuit may involve only fabrication. Furthermore, while the following description describes exemplary embodiments of the invention as applied to integrated circuits and FPGAs, those skilled in the art will recognize that the invention should not be limited to these embodiments, and that the present invention may be embodied in many different forms and may be applied to various other different types of circuitry.

Referring now to the design, manufacturing, and testing process of FIG. 1, block 111 represents register transfer level design. In designing register transfer logic, designers are generally provided specifications or rules on how a circuit is to behave or function. For example, designers may be provided a purpose and/or desired functionality of the circuit being designed, or a set of broad input/output associations.

The designers generate a set of rules, for example, programming code, which details how the circuit will function in different situations in accordance with the desired behavior. In designing each circuit, designers account for every possible situation, where increased circuit complexity generally involves more situations to be accounted for in each particular design.

In block 113, a gate level netlist is mapped to the register transfer level design. The physical implementation of the design generally begins with development of a netlist, which typically includes gate-level designs, to realize the register transfer level design, in other words, to accomplish the input/output associations desired in the developed register transfer logic. A developed netlist may include a number of interconnected instances, which may be separately developed to accomplish particular portions of the register transfer logic, whereby the interconnection of these instances represents a physical embodiment of the register transfer level design. A mapped netlist may be viewed as an initial or preliminary physical design, which is later rearranged to fit onto, for example, an integrated circuit or a programmed FPGA.

Generally, testing capabilities to run either unencrypted or encrypted test patterns are developed into respective circuits at either the register transfer level or the netlist level. For example, testing capabilities are generally incorporated into integrated circuit designs during netlist mapping, whereas FPGA designs generally incorporate testing capabilities at the register transfer level. Incorporating testing capabilities may include, for example, including a testing module or program in the design, or for example, incorporating testing leads or ports. Testing capabilities may also be realized using various different methods known to those skilled in the art.

In block 115, the netlist is implemented in a practical physical representation, for example, into a GDSII layout format for integrated circuits, or for example, compilation of an FPGA binary programming file for FPGAs. The process may include placement and routing of the mapped netlist, for example, for the circuitry of an integrated circuit to properly fit onto a fabricated chip, or for example, rearranging and refining code for an FPGA binary file to run properly and/or more efficiently. Generally, a number of suitable computer software programs familiar to those skilled in the art may be utilized to create either GDSII layouts or FPGA binary files.

In block 117, test vectors or patterns are created for the designed circuitry, and test simulations are run using the test vectors to generate a set of expected results. In some embodiments, expected test results may include regions or areas of activated circuitry during test simulations, that is, areas where there is electrical activity. The test vectors may stimulate or activate specific circuitry or areas of circuitry. Under real situations, such activated regions have higher power consumption and dissipate more heat than idle regions of the circuit, thereby increasing the temperature of the activated regions. Through the simulations, a map of a specific reference integrated circuit or FPGA physical design and an expected response to the known test vectors may thereby be developed through the simulations, such that these activated areas may be identified as areas where thermal changes are expected to be observed in each manufactured chip or circuit. Expected results in some embodiments may include thermal images including expected thermal changes at specific reference times during the running of a test vector, while in other embodiments, expected results may include a complete timeline of expected thermal readings.

In block 119, integrated circuits or FPGAs are manufactured or programmed in accordance with the GDSII layout or FPGA binary file, respectively. In many situations, manufacturing of circuits and chips are outsourced to companies which specialize in fabricating and/or programming such products or components. In some instances, these companies may compromise the integrity of the designs for various reasons, for example, by installing or programming unexpected circuitry which are otherwise undetectable, or for example, by using different materials or omitting parts of a particular circuit or design which may be utilized less frequently. In other instances, manufacturing defects may be unintentionally included.

In some embodiments, the test vector and expected results creation of block 117 may be performed and developed by utilizing one or more manufactured chips or circuits, rather than by utilizing simulated results. That is, in some embodiments, at least one test chip or circuit may be manufactured, for example, by the designers, to ensure integrity of the manufactured chip or circuit, or a number of manufactured chips or circuits may be tested to determine average activation responses. In such embodiments, the order of blocks 117 and 119 may be switched, or an additional manufacturing process, generally smaller in scale, may be performed prior to block 117.

In block 121, the final product is received. In some instances, manufacture may be performed in-house, but generally is outsourced to an outside company. The final product may be in the form of a packaged integrated circuit, or may be a programmed FPGA.

In block 123, the final product is tested. The integrated circuit or FPGA may be connected to, for example, a testing apparatus for testing. Conventional or standard testing processes, for example, automatic test pattern generators or joint test action group interfaces, may only be effective in detecting manufacturing defects which affect input/output associations. However, such testing may not be sufficient or comprehensive enough for some applications. As discussed above with respect to block 119, undesired or unexpected circuitry may be intentionally or unintentionally incorporated into the final products. Such abnormalities may be difficult or even impossible to detect using conventional testing and validation techniques, for example, if input/output associations are unchanged. For example, an unexpected circuit may include a program which records and reports operation and/or results of the integrated circuit or FPGA to a third party, but does not alter the normal functionality of the integrated circuit or FPGA. Supplementing the conventional testing techniques with thermal image comparisons of the integrated circuit or FPGA with expected results provides a new method of detecting abnormalities in fabricated integrated circuits and programmed FPGAs. For example, in a case where an unexpected circuit is activated during the running of a fabricated integrated circuit, a thermal image may reveal that an otherwise idle portion of the integrated circuit is instead activated, thereby indicating that additional circuitry may exist in that activated region. Further testing or investigation may then determine or reveal the purpose or reason behind the additional circuitry. When testing is complete, the final product is determined to be compliant or defective, and the process returns.

Figure 2:
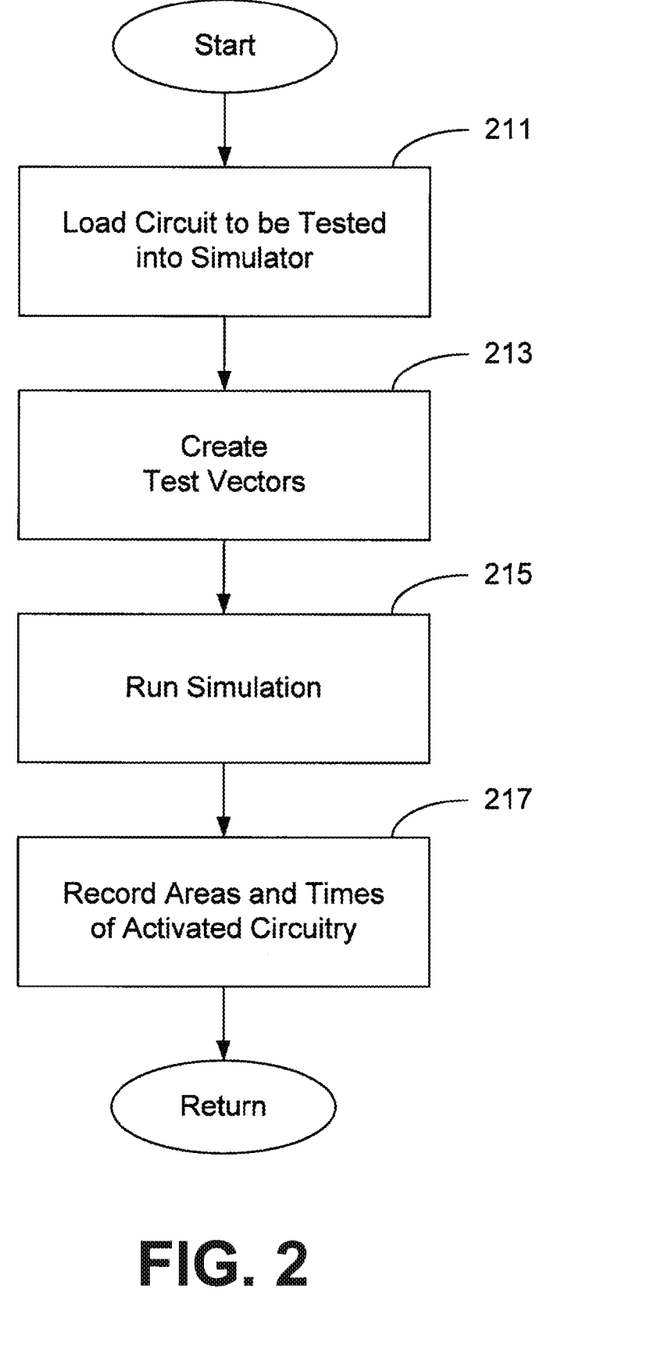
FIG. 2 is a flow diagram illustrating a process for generating test vectors and expected results from applying the test vectors to an integrated circuit or FPGA in accordance with an embodiment of the present invention.

FIG. 2 is a flow diagram illustrating a process for generating test vectors and expected results from applying the test vectors to an integrated circuit or FPGA in accordance with an embodiment of the present invention. In some embodiments, the process of FIG. 2 may be performed as block 117 in FIG. 1.

In block 211, the circuit to be tested is loaded into a simulator. In some embodiments, the simulator may be a separate testing program. The GDSII layout or FPGA binary file may be uploaded into the testing program to generate expected results. In other embodiments, a simulator may be included in the same program used to initially generate the GDSII layout or FPGA binary file. In still other embodiments, a test product or products, for example, test chips, may be first fabricated or programmed for testing purposes. In these embodiments, care should be taken to ensure that the test products themselves are not defective, so as to prevent errors or inconsistencies in expected results generated by the test products.

In block 213, test vectors are created. Test vectors may be created to test a variety of different functions of each particular integrated circuit or FPGA, and may be configured to stimulate specific regions of the integrated circuit or FPGA. In some embodiments, test vectors may be configured such that different regions of the integrated circuit or FPGA may be stimulated at different times during a test, so as to isolate whether particular regions are being stimulated at specific times, and to possibly associate any unexpected or defective circuitry specifically with a particular expected stimulation. In some embodiments, the selected regions may include particularly sensitive or important operations of the integrated circuit or FPGA, to ensure that those particular operations have not been compromised.

In block 215, the simulation is run using the created test vectors. Generally, in embodiments where the simulation is run through a software program, the program may provide information on regions which would be activated or stimulated in an integrated circuit or FPGA. Some embodiments may also include information on specific times during each test when each region is expected to be activated.

In block 217, the expected results are recorded and stored. Generally, recorded information will include at least circuit activity at specific reference times during a particular simulation. Some embodiments may record more comprehensive expected results, for example, a timeline including circuit activity during the entire duration of the particular simulation. In these embodiments, the simulation results may be broken down, such that information on expected circuit activity at any specific time during the simulation may be extracted. As discussed above, since activated regions of a circuit have higher power consumption and dissipate more heat than idle regions of the circuit, thermal images may be approximated through the simulation results based on the areas which are expected to be activated and the areas which are expected to be idle. After the simulation results are recorded and stored, the process returns.

Figure 3:
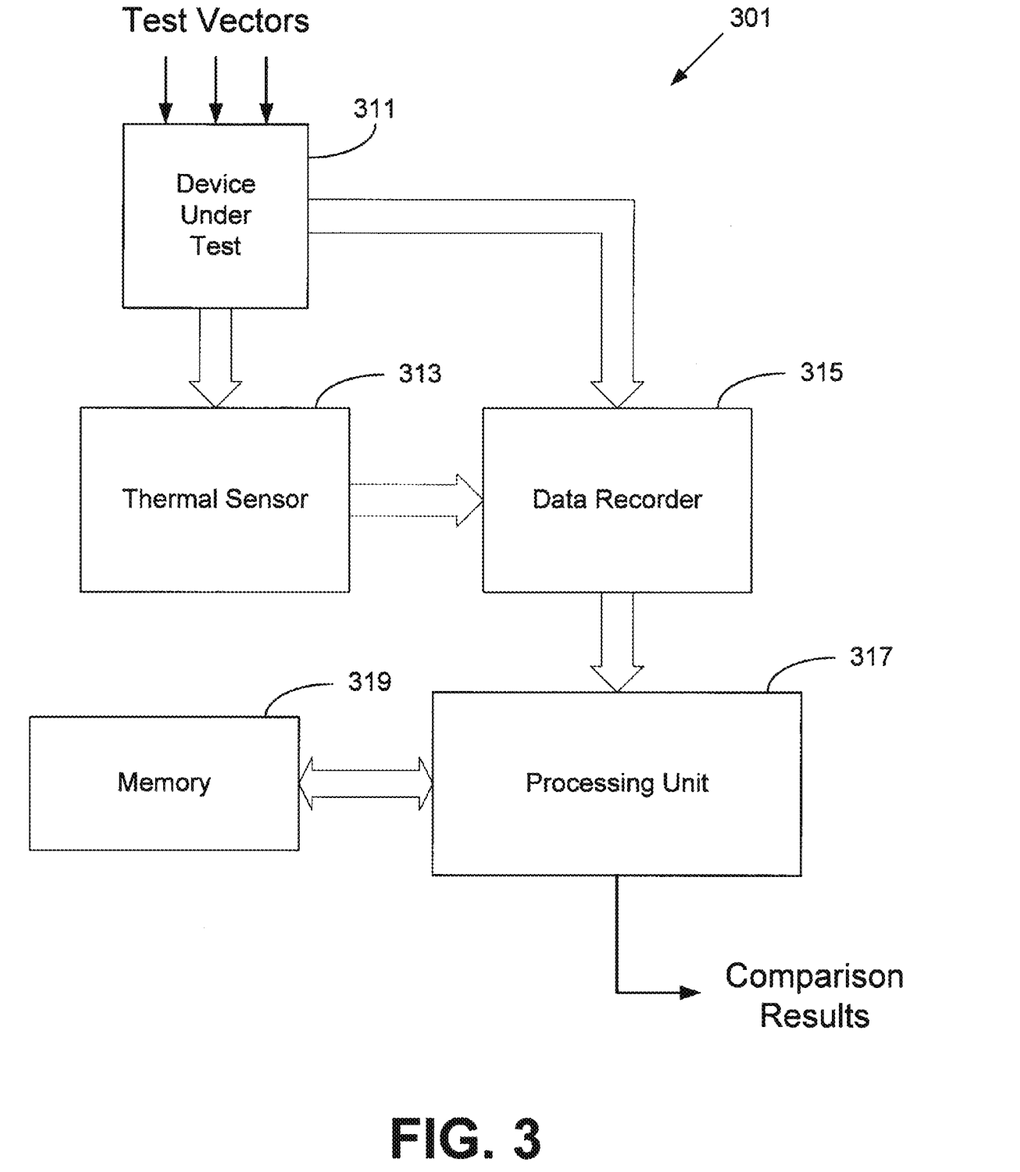
FIG. 3 is a schematic block diagram illustrating a system for testing an integrated circuit or FPGA in accordance with an embodiment of the present invention.

FIG. 3 is a schematic block diagram illustrating a system for testing a device, for example, an integrated circuit or FPGA, in accordance with an embodiment of the present invention. The testing system 301 includes a device under test 311, a thermal sensor 313, a data recorder 315, a processing unit 317, and a memory 319. In FIG. 3, the device under test communicates with the thermal sensor and the data recorder. The thermal sensor is also in communication with the data recorder, and in some embodiments, the thermal sensor and the data recorder may be included together in one apparatus. The processing unit receives data from the data recorder, and is also in communication with the memory. In some embodiments, the processing unit and memory may also be included in a single unit, or a testing apparatus may include all of the thermal sensor, data recorder, processing unit, and memory.

In FIG. 3, the testing system 301 processes test results when one or more test vectors are applied to a device under test 311. The device under test may be connected to and communicate with the rest of the testing system via, for example, an input/output port. After communication with the rest of the testing system is established, the test vectors may be applied to the device under test from, for example, the processing unit 317 of the testing system, or for example, from an external source. While the device under test runs and processes the test vectors, the device under test may transmit outputs to the data recorder 315. Meanwhile, the thermal sensor 313 may concurrently generate thermal images of the device under test while the test vectors are being applied. The thermal images may be used to determine areas of activated circuitry in the device under test, for example, areas of the integrated circuit or FPGA activated in accordance with application of the test vectors, while the device under test is processing the test vectors. In this manner, the thermal sensor identifies the coordinates of activated circuitry and, in some embodiments, the times at which said circuitry is activated. The thermal sensor also transmits collected data to the data recorder.

The data recorder 315 concurrently records data from the device under test 311 and the thermal sensor 313. The data recorder may also, in some embodiments, include a timer to log times associated with the data from the chip or circuit and the thermal sensor, respectively, and/or synchronize the times associated with the data from the device under test and the thermal sensor. The thermal sensor then transmits the collected data to the processing unit 317. The processing unit retrieves sets of expected test results from the memory 319, and compares the expected test results with the collected data from the data recorder to determine if there are any inconsistencies between the test data and the expected results. The processing unit then outputs the comparison results, for example, to a display for a user to further analyze. In some embodiments, the data recorder is integrated directly in the processing unit. In some embodiments, after collection and recordation of data, the data recorder transmits the collected data to the memory 319, and the processing unit retrieves the data collected from the device under test and the expected results both from the memory. Other embodiments of testing systems may include more or fewer components, or different combinations of components, based on each particular testing application.

Figure 4:
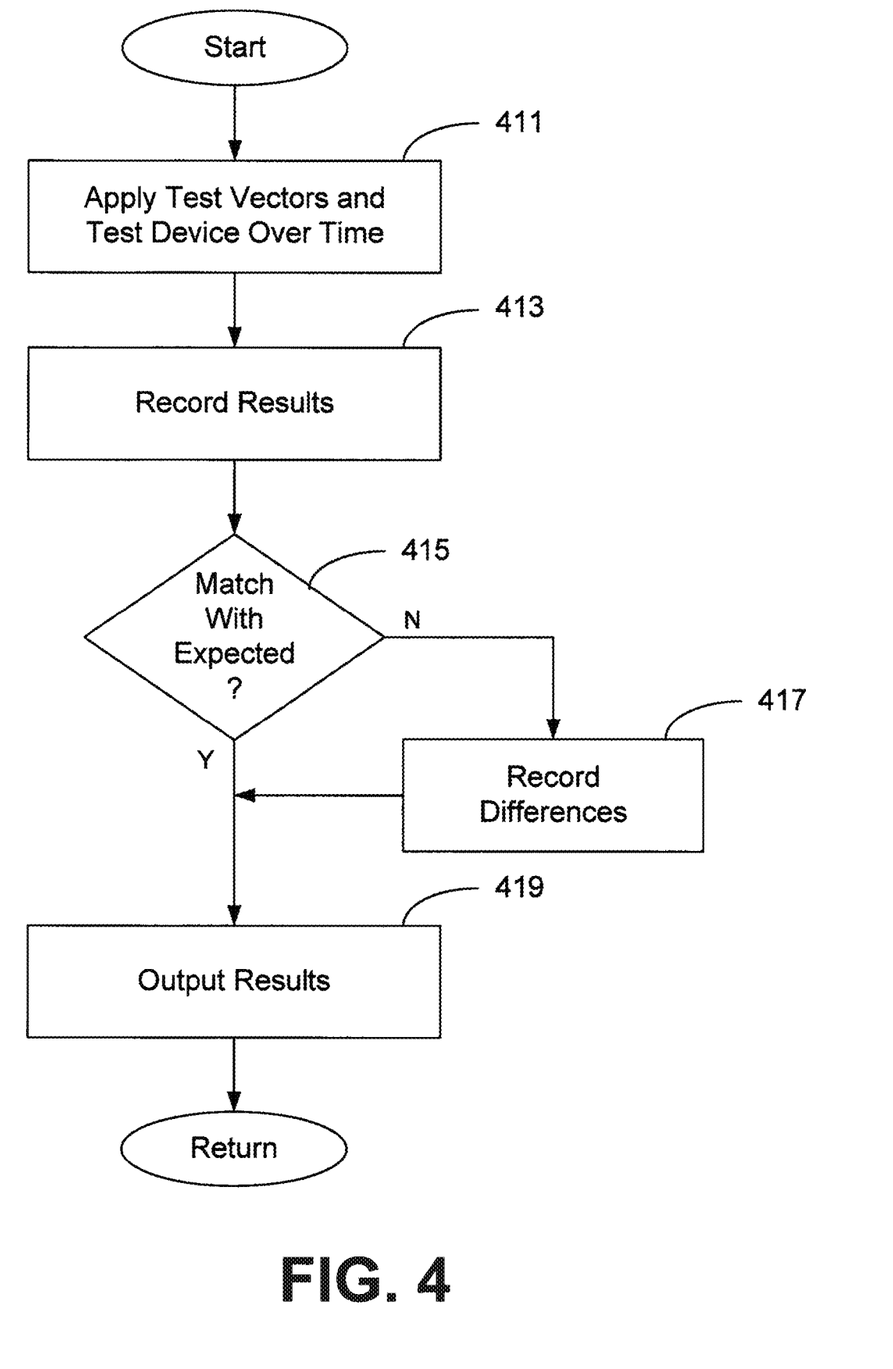
FIG. 4 is a flow diagram illustrating a process for applying test vectors to a fabricated integrated circuit or programmed FPGA and for outputting test results in accordance with an embodiment of the present invention.

FIG. 4 is a flow diagram illustrating a process for applying test vectors to a fabricated integrated circuit or programmed FPGA and for outputting test results in accordance with an embodiment of the present invention. In some embodiments, the process of FIG. 4 may be performed during block 123 of the process of FIG. 1. In some embodiments, the process of FIG. 4 may be performed by the testing system described with respect to FIG. 3.

In block 411, test vectors or test patterns are applied to the device under test, and the device is allowed to process the test vectors over time. As discussed above, the test vectors may have been created to, for example, target activation in specific portions of the device and/or to activate most or all portions of the device in a particular sequence. The test vectors may be supplied to the device through a processing unit or other similar component of a testing system with which the device is in communication. Localized activation or responses of the device may be triggered by the test vectors.

In block 413, the results of the test are recorded. As discussed above with respect to FIG. 3, results may include, for example, outputs generated by the device in accordance with specific inputs applied by the test vectors, thermal images generated by a thermal sensor monitoring the device during application of the test vectors, and timing of the outputs and thermal images. In this fashion, a dynamic record detailing the functionality or operation of the device being tested is documented. Other embodiments may include different types of results based on the specific application.

In block 415, the recorded results are compared to a set of expected results, generally to determine if the test results match with the expected results. The comparison may include, for example, whether the outputs match a set of expected outputs. The comparison may further include a detailed comparison between the thermal images generated during the test and identifying different regions of the device which were activated at different times during the test, with thermal images identifying the expected activated regions during those times. For test results which match or closely resemble the expected results, the process proceeds to block 419. For test results which do not match the expected results, the process proceeds to block 417.

In block 417, the differences between the test results and the expected results are recorded. For example, with respect to the thermal images, regions which appear to have been activated during portions of the test in which the regions were expected to be idle may indicate added circuitry. Conversely, regions which do not appear to have been activated during portions of the test in which the regions were expected to be activated may indicate missing and/or non-functioning circuitry. In such situations, recorded information may include the coordinates of the device which show added circuitry and/or missing or non-functioning circuitry, as well as a time stamp or time log associated with the discrepancy or difference. Other embodiments may include other useful data or information, depending on each specific test or application.

In block 419, the results are outputted. In some embodiments, the output may be in the form of, for example, a data file which is displayable on a display screen, for example, a computer monitor. In other embodiments, the output may be, for example, a paper or image printout for a user to review. Outputs may include information on tests which yielded the expected results, information on tests which yielded discrepancies between the test results and the expected results, or both. Once the results are outputted to a user, the process returns.

Figure 5:
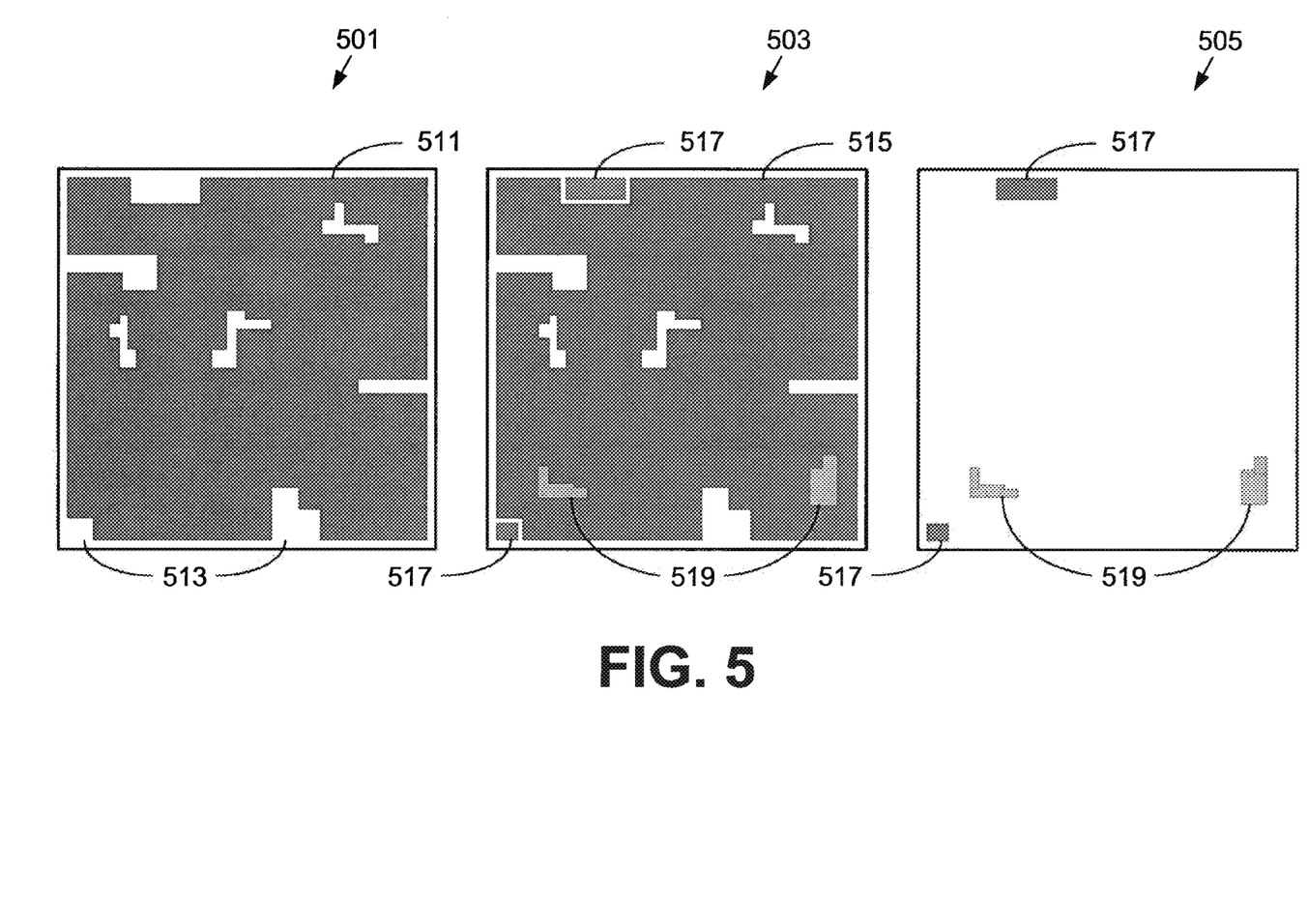
FIG. 5 is an example of a portion of test results generated in accordance with a testing process associated with embodiments of the present invention.

FIG. 5 is an example of a portion of test results generated in accordance with a testing process associated with embodiments of the present invention. The test results of FIG. 5 may be a visual representation of, for example, discrepancies between expected results and actual test results at a specific time during a thermal imaging test. In some embodiments, some of the outputted results from block 419 of FIG. 4 may resemble the test results of FIG. 5. Furthermore, the test results of FIG. 5 may serve as a simplified version of test results. Real test results may appear different, for example, with additional details or further information included, or for example, with a higher resolution. In some embodiments, for example, it may be possible to identify activated metal connections or logic gates among other circuitry in a device being tested.

Map 501 represents a thermal map of expected activated circuitry of a particular device during a portion of the testing process. Shaded area 511 indicates areas of activated circuitry, while non-shaded areas indicate areas of idle circuitry. Such a thermal map may be created by using the expected results obtained, for example, from the simulations run during the test vector and expected results generation process described in FIG. 2. In those simulations, test vectors were applied, and areas of activated circuitry in a particular device could thereby be identified. Expected results could be developed or generated based on those simulation results, since activated circuitry generally consumes more power and dissipates more heat than idle circuitry. In this manner, a comprehensive mapping of all the expected results during a particular test may be created.

Map 503 represents a thermal map of actual test results, that is, actual regions of the device which were activated during the test corresponding to the thermal map 501 of expected results. Thermal map 503 includes a shaded area 515 slightly different than shaded area 511 of expected thermal map 501. For example, additional shaded areas 517 appear near the top and bottom left areas of the thermal map 503. Shaded areas 517 indicate additional activated areas, which may represent possible added circuitry. Furthermore, additional non-shaded areas 519 appear near the bottom left and right of the thermal map 503. Non-shaded areas indicate non-activated areas which were expected to be activated, which may represent possible missing or non-functioning circuitry.

Map 505 represents a thermal map indicating and summarizing the unexpected changes or differences between thermal map 501 and thermal map 503. As indicated, the actual device yielded unexpected activated areas 517 and unexpected non-activated areas 519. Thermal map 505 may serve as a simpler visual representation of differences or inconsistencies between the expected results and the activated test results. Results for different embodiments may include different test results, for example, results for some embodiments may only include thermal maps 501 and 503, while results for other embodiments may only include thermal map 505.

Utilizing thermal imaging to test integrated circuits or FPGAs is therefore useful in detecting intentional or unintentional changes in circuitry which may otherwise go undetected using conventional testing procedures. In different embodiments, thermal imaging may be used as a stand-alone testing procedure, or may be used to supplement current testing techniques. Thermal imaging testing may be used to ensure that manufactured devices contain no more and no less than the intended circuitry and functionality, and may be utilized during, for example, manufacturing testing, component testing, and/or in-circuit testing.

Although the invention has been described with respect to certain embodiments, it should be recognized that the invention may be practiced other than as specifically described, the invention comprising the claims and their insubstantial variations supported by this disclosure.

What is claimed is:

1. A method of testing an electrical circuit, comprising:
   selecting test vectors for electrically activating portions of a first electrical circuit of a preselected design over time;
   generating a set of expected results including information on expected activity corresponding to expected thermal changes of portions of the first electrical circuit expected to be activated by application of the test vectors, times over which the portions are expected to be activated, and expected output signals associated with application of the test vectors;
   applying the test vectors to a second electrical circuit of the preselected design and generating output signals of the second electrical circuit corresponding to the test vectors;
   detecting activated portions of the second electrical circuit over time by identifying thermal changes in the second electrical circuit during application of the test vectors;
   comparing the output signals of the second electrical circuit with the expected output signals; and
   comparing a plurality of images based on the thermal changes of the second electrical circuit over time with the expected thermal changes, wherein when the second electrical circuit generates output signals matching the expected output signals, the comparison of thermal changes identifies unexpected internal activity in the second electrical circuit originating from circuitry different from circuitry associated with the preselected design that do not change or affect the generated output signals.

2. The method of claim 1, wherein identifying the unexpected internal activity comprises identifying unexpectedly activated portions of the second electrical circuit and identifying unexpectedly unactivated portions of the second electrical circuit.

3. The method of claim 1, wherein identifying the unexpected internal activity comprises recording coordinates on the second electrical circuit where each unexpected activation or non-activation occurs and a specific time during application of the test vectors at which each unexpected activation or non-activation occurs.

4. The method of claim 1, further comprising testing the second electrical circuit by utilizing an automatic test pattern generator, wherein the identifying the unexpected internal activity supplements the automatic test pattern generator testing.

5. The method of claim 1, wherein the first electrical circuit of the preselected design is a computer representation of the electrical circuit of the preselected design.

6. The method of claim 5, wherein the test vectors are selected and the set of expected results are generated based on applying the test vectors to the computer representations in computer simulations.

7. The method of claim 6, wherein the computer simulations indicate the portions of the first electrical circuit expected to be activated and times over which the portions are expected to be activated, and wherein expected thermal images are approximated based on the simulations.

8. The method of claim 7, wherein the identified thermal changes in the second electrical circuit during application of the test vectors are summarized in test thermal images, and wherein the test thermal images are compared to the expected thermal images to identify the unexpected activity.

9. The method of claim 1, wherein the test vectors are selected to sequentially activate all portions of the first electrical circuit of the preselected design during the duration of application of the test vectors.

10. The method of claim 1, wherein the first and second electrical circuits of the preselected design are integrated circuits, and wherein the testing verifies fabrication of the integrated circuits.

11. The method of claim 1, wherein the first and second electrical circuits of the preselected design include field programmable gate arrays, and wherein the testing verifies programming of the field programmable gate arrays.

12. The method of claim 1, further comprising classifying the second electrical circuit as an electrical circuit including unexpected circuits or circuit changes when unexpected internal activity in the second electrical circuit is identified.

* * * * *